United States Patent
Higuchi et al.

(10) Patent No.: US 8,080,337 B2
(45) Date of Patent: Dec. 20, 2011

(54) ELECTRODE FOR LITHIUM SECONDARY BATTERY AND LITHIUM SECONDARY BATTERY USING SAME

(75) Inventors: Hiroshi Higuchi, Kyoto (JP); Masayoshi Hiramoto, Kanagawa (JP); Futoshi Kubo, Osaka (JP)

(73) Assignee: Panasonic Corporation, Osaka (JP)

( * ) Notice: Subject to any disclaimer, the term of this patent is extended or adjusted under 35 U.S.C. 154(b) by 744 days.

(21) Appl. No.: 12/159,151

(22) PCT Filed: Dec. 27, 2006

(86) PCT No.: PCT/JP2006/326049
§ 371 (c)(1),
(2), (4) Date: Jun. 25, 2008

(87) PCT Pub. No.: WO2007/077870
PCT Pub. Date: Jul. 12, 2007

(65) Prior Publication Data
US 2010/0086857 A1    Apr. 8, 2010

(30) Foreign Application Priority Data

Dec. 27, 2005  (JP) ................. 2005-374413
Feb. 10, 2006  (JP) ................. 2006-033365
Mar. 2, 2006   (JP) ................. 2006-055830

(51) Int. Cl.
H01M 4/13   (2010.01)
H01M 4/58   (2010.01)

(52) U.S. Cl. .............. 429/218.1; 429/220; 429/221; 429/223; 429/229; 429/231; 429/231.5; 429/231.9; 429/231.95

(58) Field of Classification Search ............ 429/220, 429/221, 223, 229, 231, 231.5, 231.9, 231.95
See application file for complete search history.

(56) References Cited

U.S. PATENT DOCUMENTS

| | | |
|---|---|---|
| 2004/0048160 A1 | 3/2004 | Omaru |
| 2004/0219432 A1 | 11/2004 | Kojima et al. |
| 2005/0175900 A1 | 8/2005 | Yasuda et al. |
| 2007/0065725 A1 | 3/2007 | Inoue et al. |

FOREIGN PATENT DOCUMENTS

| | | |
|---|---|---|
| JP | 2000-090922 | 3/2000 |
| JP | 2003-168425 | 6/2003 |
| JP | 2004-103476 | 4/2004 |
| JP | 2004-139954 | 5/2004 |
| JP | 2004-319457 | 11/2004 |
| JP | 3755502 | 1/2006 |
| WO | WO 2005/038966 A1 | 4/2005 |

OTHER PUBLICATIONS

ASM Metals Handbook Desk Edition, $2^{nd}$ edition. Ed. Joseph R. Davis. 1998.*
Chinese Office Action, w/ English translation thereof, issued in Chinese Patent Application No. CN 2006800491581 dated Dec. 4, 2009.

* cited by examiner

Primary Examiner — Jennifer Michener
Assistant Examiner — Heng Chan
(74) Attorney, Agent, or Firm — McDermott Will & Emery LLP

(57) ABSTRACT

The present invention has an object of providing a lithium secondary battery and an electrode for a lithium secondary battery having a superb cycle characteristic.
The present invention relates to an electrode for a lithium secondary battery, and a lithium secondary battery including the electrode, the electrode including a current collector and an active substance structure provided on the current collector, wherein the active substance structure includes at least one first layer containing a first material for occluding and releasing lithium ions and at least one second layer containing a conductive second material which does not chemically react with lithium; the first layer and the second layer are alternately laminated; and the second layer has a Young's modulus larger than the Young's modulus of the first layer.

11 Claims, 5 Drawing Sheets

ELECTRODE FOR LITHIUM SECONDARY BATTERY AND LITHIUM SECONDARY BATTERY USING SAME

RELATED APPLICATIONS

This application is the U.S. National Phase under 35 U.S.C. §371 of International Application No. PCT/JP2006/326049, filed on Dec. 27, 2006, which in turn claims the benefit of Japanese Application No. 2005-374413, filed on Dec. 27, 2005, Japanese Application No. 2006-033365, filed on Feb. 10, 2006 and Japanese Application No. 2006-055830, filed on Mar. 2, 2006, the disclosures of which Applications are incorporated by reference herein.

TECHNICAL FIELD

The present invention relates to an electrode for a lithium secondary battery, and a lithium secondary battery using the same.

BACKGROUND ART

Demands for compact electric and electronic devices such as mobile communication devices and the like are more and more growing today, and the production of secondary batteries usable for these devices is also growing. Among the secondary batteries, the production amount of lithium secondary batteries (also referred to as "lithium ion secondary batteries") having a high energy density is conspicuously growing. As applications of the electric and electronic devices is now diversified and efforts are being made to reduce the size thereof, the secondary batteries are desired to have more improved performance. Specifically, it is strongly desired to increase the discharge capacity and extend the life.

In lithium secondary batteries commercially available today, a Li-containing composite oxide such as $LiCoO_2$ or the like is used for a positive electrode and graphite is used for a negative electrode (negative electrode active substance). However, since a negative electrode formed of graphite can occlude lithium ions only up to a composition of $LiC_6$, the capacity per volume of lithium ions which can be occluded and released is theoretically 372 mAh/g at the maximum. This value is merely about ⅕ of the theoretical capacity of lithium metal. In other words, the capacity of lithium secondary batteries commercially available today is merely about ⅕ of the capacity of a lithium secondary battery using lithium as a negative electrode.

As substances capable of reversibly occluding or releasing lithium ions, metallic elements such as Al, Ga, In, Si, Ge, Sn, Pb, As, Sb, Bi and the like and alloys thereof are known. The theoretical capacities per volume thereof are, for example, as follows, and are all greater than the capacity per volume of a carbonaceous material such as graphite or the like.

Si: 2377 $mAh/cm^3$
Ge: 2344 $mAh/cm^3$
Sn: 1982 $mAh/cm^3$
Al: 2167 $mAh/cm^3$
Sb: 1679 $mAh/cm^3$
Bi: 1768 $mAh/cm^3$
Pb: 1720 $mAh/cm^3$

However, these materials significantly expand or contract at the time of reaction of occluding or releasing lithium ions. As shown in FIG. 10, a negative electrode of a lithium secondary battery generally includes a current collector 3 and a negative electrode material 101 for occluding lithium ions, which is attached to the current collector 3. Such a structure causes a problem that the negative electrode material 101 is delaminated from the current collector 103 by expansion and contraction thereof, resulting in capacity decrease.

To overcome this problem, Patent Document 1, for example, proposes a porous firm body formed of a ceramic material in which the pores are filled with silicon. Such a porous body is a frame for holding silicon, which is an expandable and contractable negative electrode active substance, with a mechanical strength thereof. As such a ceramic material, Patent Document 1 discloses using ceramics containing a substrate of one, or at least two, of carbides, borides, nitrides and oxides of an element selected from Be, Mg, Ti, Zr, V, Nb, Cr, Fe, Co, Ni, B, Al and Si.

In relation with the above-described problem, Patent Document 2 discloses that in order to guarantee electric contact between the substances even when the film of the active substance is ruptured, a current collector having a Cu/Sn/Cu structure is formed on a polyester film substrate and a film of an active substance is formed thereon In order to realize a laminate structure such as a structure of a carbon material and suppress further pulverization of active substance powder during a charging/discharge process, Patent Document 3 discloses forming a laminate structure of an active substance layer and a Cu—Sn layer.

Patent Document 4 proposes a laminate structure in which a layer formed of a metal material having a low ability of forming a lithium compound is interposed between layers formed of Sn, Al, Sn alloy or Al alloy having a high ability of forming a lithium compound.

Patent Document 1: Japanese Laid-Open Patent Publication No. 2000-090922
Patent Document 2: Japanese Patent No. 3755502
Patent Document 3: Japanese Laid-Open Patent Publication No. 2003-168425
Patent Document 4: Japanese Laid-Open Patent Publication No. 2004-139954

DISCLOSURE OF THE INVENTION

Problems to be Solved by the Invention

However, with the structure disclosed in Patent Document 1, the volume of the pores formed by the porous ceramic body is not sufficient. For example, where the porosity is about 50%, even if ¼ of the volume of the pores is filled with a negative electrode active substance, the capacity density is merely about 1185 $Ah/cm^3$ at the maximum. If the pores are filled with a larger amount of active substance, the space into which the active substance can expand is lost. For this reason, the structure of Patent Document 1 cannot improve the capacity density.

The ceramic materials disclosed in Patent Document 1 are subjected to a reduction reaction by lithium. The reduced porous body is breakable and pulverized, and lithium oxide or lithium nitride generated in the porous body gives an unnecessary stress to the porous body. Thus, the porous body loses its original strength, which deteriorates the cycle characteristic.

In consideration that a reduction reaction will occur, an extra amount of lithium needs to be injected into the lithium secondary battery beforehand. Or, the capacity density is decreased to below the designed value due to the lithium used for the reduction reaction.

Some of the ceramic materials disclosed in Patent Document 1, for example, SiC, MgO, $Al_2O_3$, $TiO_2$, $ZrO_2$ and $Fe_3O_4$ are poor in electron conductivity. Thus, it is considered to be difficult to realize a practical lithium secondary battery.

Patent Documents 2 through 4 all adopt a laminate structure of a first layer formed of Sn and a second layer formed of a metal material such as Cu, Ni, Fe, Co, Cr or the like or a stainless steel alloy. Studies performed by the present inventors on the technology described in these patent documents have found that the electrodes are deformed and as a result, the capacity is decreased because the structure is not designed to sufficiently withstand a stress caused by the expansion of the first layer formed of Sn.

Regarding the structures disclosed in Patent Documents 2 through 4, it is conceivable to increase the thickness of the second layer in order to supplement the strength. In this case, however, the capacity density is lowered in correspondence with the increased thickness. In addition, a new problem arises that the lithium permeability of the second layer is spoiled and thus the capacity is decreased.

In addition to a negative electrode active substance, a positive electrode active substance also expands by occluding lithium ions. Thus, the above-described problems occur also to the positive electrode.

The present invention has an object of solving at least one of the problems of the conventional art and providing a lithium secondary battery and an electrode for a lithium secondary battery having a superb cycle characteristic.

Means for Solving the Problems

An electrode for a lithium secondary battery according to the present invention includes a current collector and an active substance structure provided on the current collector. The active substance structure includes at least one first layer containing a first material for occluding and releasing lithium ions and at least one second layer containing a conductive second material which does not chemically react with lithium. The first layer and the second layer are alternately laminated. The second layer has a Young's modulus larger than the Young's modulus of the first layer.

In one preferable embodiment, the second material is a conductive metal compound.

In one preferable embodiment, the second material has a Young's modulus of 200 GPa or greater.

In one preferable embodiment, the second material is one material selected from metal nitrides, metal carbides and metal borides.

In one preferable embodiment, the second material is a nitride of a group 4A metal material.

In one preferable embodiment, the second material is one, or a mixture of two, selected from titanium nitride, zirconium nitride and hafnium nitride.

In one preferable embodiment, at least two first layers and at least two second layers are included.

In one preferable embodiment, the second layer has a thickness of smaller than 6 nm.

In one preferable embodiment, the first layer has a thickness of equal to or smaller than 4.5 nm.

In one preferable embodiment, the second layer has a plurality of openings.

In one preferable embodiment, the electrode is a negative electrode.

In one preferable embodiment, the first material contains at least one selected from silicon, germanium and tin.

In one preferable embodiment, the electrode is a positive electrode.

In one preferable embodiment, the first material contains a composite oxide or a composite sulfide of a transition metal material containing lithium.

A lithium secondary battery according to the present invention includes a positive electrode capable of occluding and releasing lithium ions; a negative electrode formed of an electrode for a lithium secondary battery defined by any of the above; and an electrolyte having lithium ion conductivity.

A lithium secondary battery according to the present invention includes a positive electrode formed of an electrode for a lithium secondary battery defined by any of the above; a negative electrode capable of occluding and releasing lithium ions; and an electrolyte having lithium ion conductivity.

Effects of the Invention

With an electrode for a lithium secondary battery according to the present invention, the second layer suppresses the first layer from expanding or contracting in the horizontal direction and selectively permits the first layer to expand or contract in the vertical direction. In addition, the second layer is not subjected to a reduction reaction by lithium even when lithium ions migrate in accordance with the charge and discharge process, and thus the mechanical strength of the second layer is not lowered. Therefore, the second layer can prevent the first layer from being delaminated or coming off from the current collector while permitting a volumetric change of the first layer caused by occlusion or release of lithium ions. Thus, the cycle life of the lithium secondary battery can be extended.

DESCRIPTION OF THE REFERENCE NUMERALS

| | |
|---|---|
| 1 | First layer |
| 2 | Second layer |
| 3 | Current collector |
| 4 | Active substance structure |
| 5 | Opening |
| 10 | Electrode for lithium secondary battery |
| 20 | Coin-shaped lithium secondary battery |
| 21 | Positive electrode case |
| 22 | Positive electrode |
| 23 | Separator |
| 24 | Negative electrode |
| 25 | Gasket |
| 26 | Sealing plate |
| 30 | Cylindrical lithium secondary battery |
| 31 | Negative electrode |
| 32 | Separator |
| 33 | Positive electrode |
| 34 | Battery case |
| 35 | Sealing plate |
| 36 | Insulating gasket |
| 37 | Tab |

BEST MODE FOR CARRYING OUT THE INVENTION

Hereinafter, embodiments of an electrode for a lithium secondary battery, and a lithium secondary battery using the same according to the present invention will be described with reference to the drawings.

Embodiment 1

Figure 1:
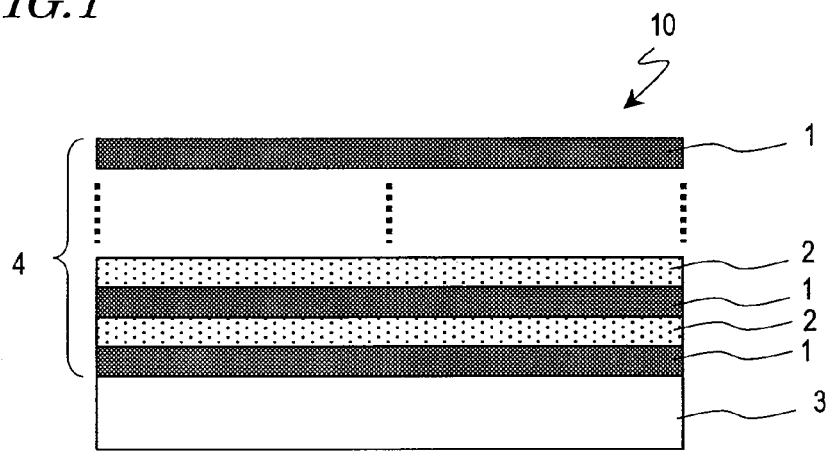
FIG. 1 is a cross-sectional view schematically showing a structure of an electrode for a lithium secondary battery in one embodiment according to the present invention.

FIG. 1 is a cross-sectional view schematically showing a structure of an electrode for a lithium secondary battery in one embodiment according to the present invention. The electrode for a lithium secondary battery according to the present invention effectively prevents the following situation: an active substance expands or contracts when occluding or releasing lithium ions and as a result, is physically delaminated or comes off from a current collector, and thus cannot keep electric contact with the current collector. Since such problems occur in both of a positive electrode and a negative electrode of a lithium secondary battery, the electrode for a lithium secondary battery according to the present invention is preferably usable for both of the positive electrode and the negative electrode of a lithium secondary battery.

As shown in FIG. 1, an electrode 10 for a lithium secondary battery includes a current collector 3 and an active substance structure 4.

The current collector 3 applies a voltage to the entirety of the active substance structure 4 for charging, and collects charges generated in the active substance structure 4 and removes the charges outside for discharging. In the case where the electrode 10 for a lithium secondary battery is used as a negative electrode, the current collector 3 may be formed using copper, nickel, stainless steel or any other material known as a material of a current collector of a negative electrode for a lithium secondary battery. In the case where the electrode 10 for a lithium secondary battery is used as a positive electrode, the current collector 3 may be formed using aluminum, nickel, a nickel-based alloy (additive element is mainly aluminum, silicon, carbon, etc.) or any other material known as a material of a current collector of a positive electrode for a lithium secondary battery.

The current collector 3 generally includes a foil-like member having a thickness of about 10 to 20 μm, but it is technologically possible to form the current collector 3 with a thickness of several micrometers. The current collector 3 used in this embodiment may also have a thickness of several micrometers.

The active substance structure 4 is provided on, and is electrically connected to, the current collector 3.

As shown in FIG. 1, the active substance structure 4 includes at least one first layer 1 and at least one second layer 2. The first layer 1 and the second layer 2 are laminated alternately. Preferably, at least two first layers 1 and at least two second layers 2 are included such that at least one first layer 1 is interposed between a pair of two second layers 2.

The first layer 1 includes a first material for occluding and releasing lithium ions as an active substance. In the case where the electrode 10 for a lithium secondary battery is used as a negative electrode, the first material is preferably a substance which can form an alloy with lithium and has a large capacity per volume for occluding lithium ions. Specifically, the first material is preferably one, or a mixture of two, selected from silicon, germanium and tin. Alternatively, the first material may contain an oxide such as a silicon oxide, a germanium oxide, a tin oxide or the like and another material for occluding lithium ions. The first material may contain a transition metal material such as tungsten, nickel, cobalt, molybdenum, chromium, iron or the like, which can suppress the expansion and reduce the electric resistance.

In the case where the electrode 10 for a lithium secondary battery is used as a positive electrode, the first material contains one, or at least two, among transition metal composite oxides and transition metal composite sulfides of Ti, Mo, W, Nb, V, Mn, Fe, Cr, Ni, Co and the like, each oxide and each sulfide containing lithium. Organic conductive substances including vanadium oxides and conjugated polymers; Chevrel phase compounds and the like are also usable as a positive electrode active substance.

Figure 2:
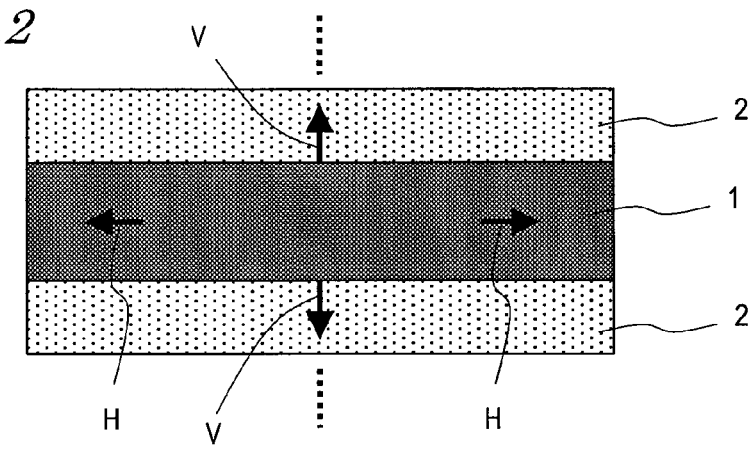
FIG. 2 is a view illustrating a mechanism for suppressing a volumetric change of a first layer in the electrode shown in FIG. 1.

The second layer 2 has a larger Young's modulus than the first layer 1. As shown in FIG. 2, the first layer occludes lithium ions and thus expands in a direction horizontal to the first layer 1 represented with arrow H and in a direction vertical to the first layer 1 represented with arrow V. When releasing the lithium ions, the first layer 1 contracts in the directions opposite to the directions represented with these arrows. At this point, the second layer 2, which has a larger Young's modulus than the first layer 1, can suppress a volumetric change of the first layer 1 toward the direction represented with arrow H, i.e., the direction horizontal to the first layer 1. With this action, the second layer 2 prevents the first layer 1 from being delaminated or coming off from the current collector 3. By contrast, the second layer 2 does not bind the first layer 1 in the direction represented with arrow V vertical to the first layer 1. Therefore, the first layer 1 can expand or contract in the vertical direction to occlude or release the lithium ions. Namely, since the first layer 1 and the second layer 2 are laminated so as to suppress a volumetric change in a direction horizontal to the surface along which the current collector 3 and the active substance structure 4 contact each other, the active substance structure 4 is prevented from being delaminated or coming off from the current collector 3.

The second layer 2 exists between the plurality of laminated first layers 1 and so is preferably conductive. The second layer 2 also preferably does not chemically react with lithium. In consideration of these points, a second material used to form the second layer 2 is preferably a conductive metal compound, and more preferably is one selected from metal nitrides, metal carbides and metal borides. Metal compounds, especially, metal nitrides, metal carbides and metal are stable and do not chemically react with lithium. These metal compounds generally have a large Young's modulus and thus can be used to form the second layer having a larger Young's modulus than the first layer 1 where any of the above-listed materials is selected as the first material for the first layer 1.

The second material for forming the second layer 2 may be, for example, a metal nitride such as titanium nitride, zirconium nitride, hafnium nitride, vanadium nitride, niobium nitride, tantalum nitride or the like; a metal boride such as titanium boride, zirconium boride, hafnium boride, vanadium boride, chromium boride, niobium boride, tantalum boride, molybdenum boride, tungsten boride or the like; or a metal carbide such as titanium carbide, zirconium carbide, chromium carbide, niobium carbide, tantalum carbide, molybdenum carbide, tungsten carbide or the like.

As a result of examining the Young's modulus of the first layers 1 formed of various materials, it was found that the Young's modulus of the first layer 1 formed of any of the first materials described above by a known thin film technique is about 100 GPa, irrespective of whether the first layer 1 contains a positive electrode active substance or a negative electrode active substance. For example, a silicon layer formed by sputtering to be used for a negative electrode has a Young's modulus of about 90 GPa, and a layer formed of a lithium-cobalt composite oxide to be used for a positive electrode has a Young's modulus of about 100 GPa. Considering that the Young's modulus of single crystalline silicon is about 180° GPa, it is understood that as long as the second layer 2 has a Young's modulus of about 200 GPa or greater, the second layer 2 acts as a binding layer for suppressing the expansion and contraction of the first layer 1. Namely, a sufficient Young's modulus of the second material used for the second layer 2 is 200 GPa or greater.

As a result of examining various materials, it was found that the nitrides, carbides and borides of group 4A metal materials are more preferable as the second material because these materials do not chemically react with lithium and have a Young's modulus of about 250 GPa or greater when used to form the second layer 2.

Titanium nitride, zirconium nitride and hafnium nitride are especially preferable as the second material because these materials can be used for forming a thin film usable for the second layer 2 relatively easily using a known thin film technique. It was also found that titanium nitride, zirconium nitride and hafnium nitride have a very large standard free energy of formation with respect to lithium nitride and so are very stable against lithium, and so are most preferable as the second material in terms of chemical and physical properties. Therefore, it is most preferable to use one, or a mixture of two, selected from titanium nitride, zirconium nitride and hafnium nitride as the second material.

In order to obtain the above-described effects of the second layer 2, it is preferable that the first layer 1 and the second layer 2 are in close contact with each other. However, it is not absolutely necessary that the first layer and the second layer 2 are in direct contact with each other. For example, a layer which is unlikely to chemically react with lithium, has lithium ion permeability, and is electrically conductive may be formed between the first layer 1 and the second layer 2.

Any number of the first layers 1 and the second layers 2 may be laminated with no specific limitation. The effects of the present invention are provided by interposing the first layer 1 using the current collector 3 or the second layer(s) 2. As the number of the first layers 1 and the second layers 2 is increased, a larger amount of lithium can be occluded or released, which can increase the charging capacity of a lithium secondary battery using the electrode 10 for a lithium secondary battery. For example, when the electrode 10 for a lithium secondary battery is used as a negative electrode of a cylindrical 18650 lithium secondary battery having a diameter of 18 mm and a height of 65 mm, the total number of the first layers 1 and the second layers 2 can be 1500 layers or more and 9000 layers or less.

The first layer 1 and the second layer 2 can be formed using a known thin film technique utilized in semiconductor production processes or the like. Specifically, thin film techniques such as vapor deposition, sputtering, CVD, PVD and the like are usable to form the first layer 1 and the second layer 2 having a volume density of about 90% with respect to the inherent density of the respective material and to provide a good inter-layer close contact. Chemical film formation techniques such as plating, sol-gel method and the like, coating techniques such as inkjet printing, gravure printing, screen printing, spin-coating and the like may be used to form the first layer 1 and the second layer 2 as long as the obtained first layer 1 and second layer 2 are sufficiently elaborately formed with a good contact. Alternatively, such a coating technique may be used to form one or both of a precursor of the first material and a precursor of the second material into a layer, and then one of both of the first layer 1 and the second layer 2 may be formed using a post-treatment process such as drying, sintering or the like.

In FIG. 1, among the layers of the active substance structure 4, the first layer 1 contacts the current collector 3. Alternatively, the second layer 2 may contact the current collector 3. In the case where lithium contained in the first layer 1, the first material used for the first layer 1 and the current collector 3 react with each other, the active substance structure 4 is preferably formed such that the second layer 2 contacts the current collector 3 in order to suppress such a reaction. In FIG. 1, the uppermost layer of the active substance structure 4 is the first layer 1. Alternatively, the uppermost layer may be the second layer 2.

The second layer 2 is preferably lithium permeable. Therefore, in the case where the second layer 2 is a complete film with no pore, a thickness $T_2$ of the second layer 2 preferably fulfills 0 nm<$T_2$<6 nm. When the thickness $T_2$ is greater than 6 nm, the lithium permeability is lowered and so the initial discharge capacity is decreased to a level which may not be suitable to a large-capacity lithium secondary battery. A thickness $T_1$ of the first layer 1 preferably fulfills 0 nm<$T_1$≦4.5 nm. Where the thickness $T_2$ is set in the above-mentioned range, when the thickness $T_1$ is greater than 4.5 nm, the strength of the second layer 2 is relatively small, which may reduce the effects of the present invention. In the case where the second layer 2 has pores and so the thickness $T_2$ can be set to 6 nm or greater, there is no specific limitation on the thickness $T_1$.

Figure 3:
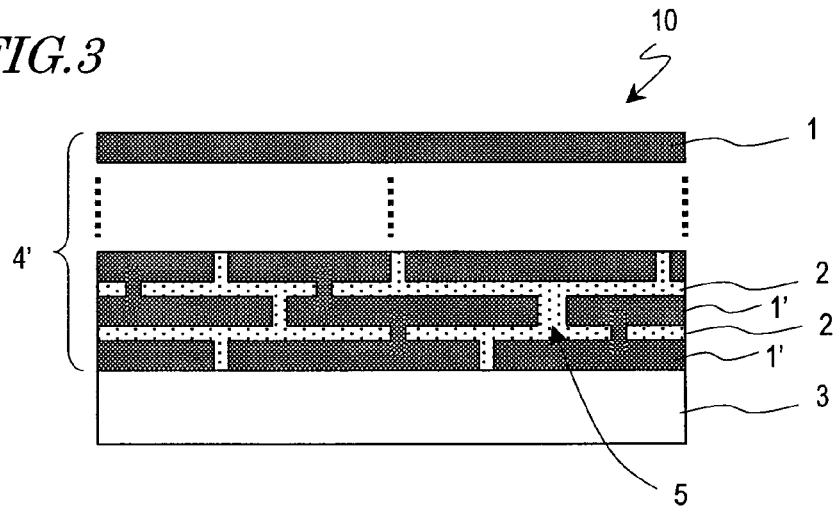
FIG. 3 is a cross-sectional view schematically showing a structure of an electrode for a lithium secondary battery in another embodiment according to the present invention.

As shown in FIG. 3, the second layer 2 may have a porous structure with openings 5 such as pinpoles, pores or the like for exposing an underlayer. The openings 5 can be formed as follows: when the second layer 2 is formed by sputtering, vapor deposition, CVD or the like, the second layer 2 does not cover parts of the underlayer under certain film formation conditions, for example, at a certain temperature. The openings 5 are preferably filled with the material of the adjacent layer, i.e., the first material of the first layer 1. The openings 5 may be in any shape at a main surface of the first layer 1 with no specific limitation, and may be linear, lattice-shaped or dot-shaped. The openings 5 may be intentionally formed as follows. In the process of forming the second layer 2 by sputtering, vapor deposition, CVD or the like, the surface, on which the second layer 2 is to be formed, is covered with a mask having openings in a prescribed pattern. As the mask, a metal mask, a resist mask or the like is usable.

By providing the openings 5 in the second layer 2, the electron conductivity and the ion conductivity of the active substance structure 4 in the vertical direction are improved. In this case, lithium ions can permeate even if the second layer 2 has a thickness of greater than 6 nm.

With the electrode for a lithium secondary battery in this embodiment, the second layer 2 suppresses the first layer 1 from expanding or contracting in the horizontal direction and selectively permits the first layer 1 to expand or contract in the vertical direction. In addition, the second layer 2 is not subjected to a reduction reaction by lithium even when lithium ions migrate in accordance with the charge and discharge process, and thus the mechanical strength of the second layer 2 is not lowered. Therefore, the second layer 2 can prevent the first layer 1 from being delaminated or coming off from the current collector 3 while permitting a volumetric change of the first layer 1 caused by occlusion or release of lithium ions. Thus, the cycle life of the lithium secondary battery can be extended. Since the first layer 1 can be prevented from being delaminated or coming off from the current collector 3 while being permitted to be volumetrically changed by occlusion and release of lithium ions, a substance having a higher lithium occlusion ability than carbon can be used as a negative electrode active substance, which realizes a lithium secondary battery having a larger capacity and a higher cycle characteristic.

Embodiment 2

Figure 4:
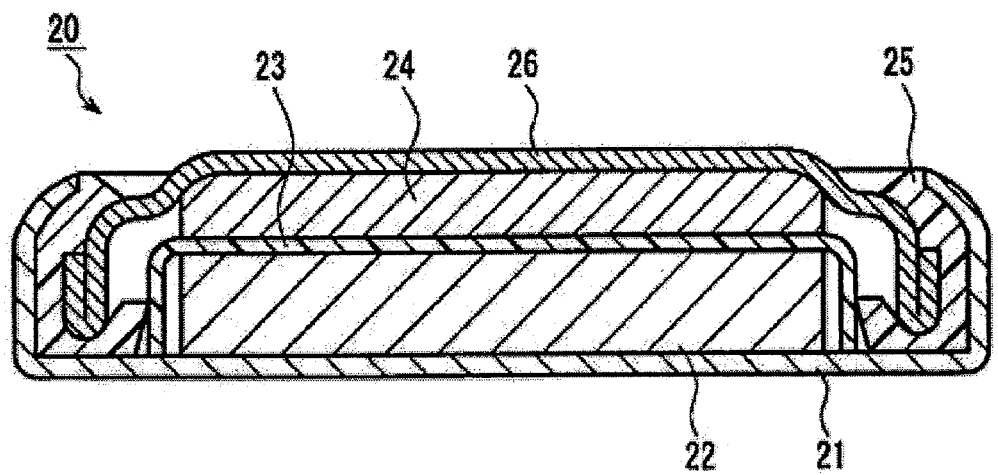
FIG. 4 is a cross-sectional view schematically showing a structure of a lithium secondary battery in one embodiment according to the present invention.

Next, a lithium secondary battery according to the present invention will be described. FIG. 4 is a cross-sectional view of a coin-shaped lithium secondary battery 20. The lithium secondary battery 20 includes an electrode group including a positive electrode 22, a negative electrode 24, and a separator 23 located between the positive electrode 22 and the negative electrode 24. The electrode group is impregnated with an electrolyte (not shown) having lithium ion conductivity. The positive electrode 22 is electrically connected to a positive electrode case 21 also acting as a positive electrode terminal. The negative electrode 24 is electrically connected to a sealing plate 26 also acting as a negative electrode terminal. The lithium secondary battery 20 is entirely sealed with a gasket 25.

As a positive electrode active substance contained in the positive electrode 22, one, or at least two, among transition metal composite oxides and transition metal composite sulfides of Ti, Mo, W, Nb, V, Mn, Fe, Cr, Ni, Co and the like, each oxide and each sulfide containing lithium, are usable. Organic conductive substances including vanadium oxides and conjugated polymers; Chevrel phase compounds and the like are also usable as a positive electrode active substance. When producing a battery for the purpose of evaluating the capacity of the negative electrode, lithium metal may be used.

As the electrolyte, any of nonaqueous electrolyte solutions containing lithium salt dissolved in an organic solvent, polymeric electrolytes, inorganic solid electrolytes, polymeric/inorganic solid electrolyte composites is usable. As the solvent of the nonaqueous electrolyte solutions, one, or at least two, among chained esters, γ-lactones, chained ethers, cyclic ethers, nitriles and the like are usable.

Usable examples of chained esters include ethylene carbonate, propylene carbonate, dimethyl carbonate, diethyl carbonate, methylethyl carbonate, and the like. Usable examples of γ-lactones include γ-butyl lactone and the like. Usable examples of chained ethers include 1,2-dimethoxyethane, 1,2-diethoxyethane, ethoxymethoxyethane and the like. Usable examples of cyclic ethers include tetrahydrofurans and the like. Usable examples of nitriles include acetonitriles and the like.

For the solute (supporting electrolyte) of the nonaqueous electrolyte solutions, lithium salts such as $LiAsF_6$, $LiBF_4$, $LiPF_6$, $LiAlCl_4$, $LiClO_4$, $LiCF_3SO_3$, $LiSbF_6$, $LiSCN$, $LiCl$, $LiC_6H_5SO_3$, $LiN(CF_3SO_2)_2$, $LiC(CF_3SO_2)_3$, $LiC_4P_9SO_3$ and the like, and mixtures thereof are usable.

Substances usable as the separator 23 include porous materials, for example, porous polymer film formed of polyolefin such as polypropylene, polyethylene or the like; glass filter; and nonwoven cloth materials.

As the negative electrode 24, the electrode 10 for a lithium secondary battery described in Embodiment 1 is used. For example, silicon is used as the first material, and titanium nitride is used as the second material. Using these materials, the negative electrode 24 is formed on the current collector 3 of copper foil by, for example, alternately laminating the first layers 1 each having a thickness of 3 nm and the second layers 2 each having a thickness of 3 nm by sputtering by a total of 500 times.

The lithium secondary battery 20 can prevent the negative electrode active substance from being delaminated or coming off from the current collector and can permit lithium to be occluded both in the negative electrode. Therefore, a negative electrode active substance capable of occluding a larger amount of lithium is usable. Thus, a lithium secondary battery having a larger capacity and a higher cycle characteristic can be realized.

Embodiment 3

Figure 5:
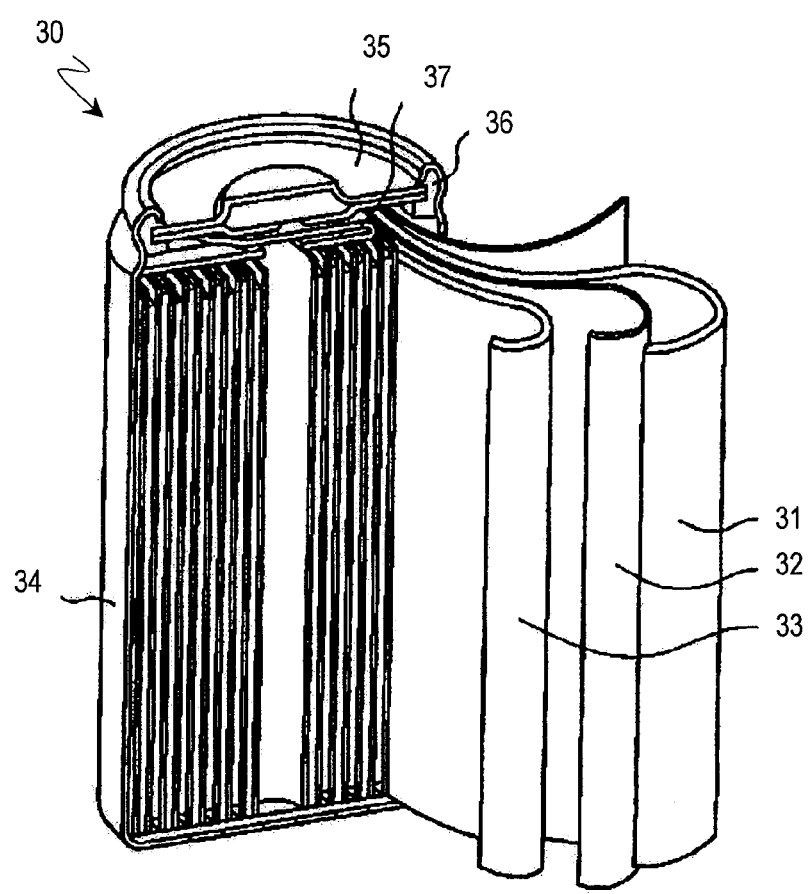
FIG. 5 is a cross-sectional view schematically showing a structure of a lithium secondary battery in another embodiment according to the present invention.

Next, a lithium secondary battery in another embodiment according to the present invention will be described. FIG. 5 is a cross-sectional view of a cylindrical lithium secondary battery 30. The lithium secondary battery 30 includes an electrode group including a negative electrode 31, a positive electrode 33 and a separator 32. The electrode group includes the separator 32 interposed between the positive electrode 33 and the negative electrode 31, and is rolled. The electrode group of a laminate structure is accommodated in a battery case 34, which is filled with an electrolyte (not shown) having lithium ion conductivity.

An open end of the battery case 34 is covered with a sealing plate 35 and an insulating gasket 36, so as to seal the inside of the battery 30. The positive electrode 33 is electrically connected to the sealing plate 35 via a tab 37, and the sealing plate 35 also acts as a positive electrode terminal of the battery 30. The negative electrode 31 is electrically connected to the battery case 34, which also acts as a negative electrode terminal of the battery 30.

For the negative electrode 31, the separator 32, the positive electrode 33 and the electrolyte, the materials described in Embodiment 2 are usable, for example.

The lithium secondary battery 30 can prevent the negative electrode active substance from being delaminated or coming off from the current collector and can permit lithium to be occluded both in the negative electrode. Therefore, a negative electrode active substance capable of occluding a larger amount of lithium is usable. Even where the electrode group is in a laminate structure, the negative electrode active substance can expand in the direction of lamination. This allows lithium to be occluded and released without the negative electrode active substance being delaminated or coming off from the current collector. Thus, a lithium secondary battery having a larger capacity and a higher cycle characteristic can be realized.

The lithium secondary batteries described in Embodiments 2 and 3 are mere examples of the present invention. The present invention is also applicable to lithium secondary batteries of other forms. Specifically, a lithium secondary battery according to the present invention may be of any type, for example, button-shaped, sheet-shaped, flat or polygonal. For the positive electrode, electrolyte, separator and the like of the lithium secondary battery, any known materials are usable.

In Embodiments 2 and 3, the electrode for a lithium secondary battery in Embodiment 1 is used as the negative electrode. Alternatively, the electrode for a lithium secondary battery in Embodiment 1 may be used as the positive electrode. As described above in Embodiment 1, in the positive electrode also, the positive electrode active substance expands or contracts due to the occlusion or release of lithium. Therefore, substantially the same effects can be provided as those obtained in the case where the electrode for a lithium secondary battery in Embodiment 1 is used as the negative electrode. The electrode for a lithium secondary battery in Embodiment 1 may be used as both of the positive electrode and the negative electrode.

In order to confirm the effects of an electrode for a lithium secondary battery according to the present invention, various experiments were performed. The results will be described below.

EXAMPLE 1

A sputtering apparatus which allows a plurality of targets to be set thereon and has a function of moving the substrate between the targets and a function of changing gas components and gas flow rate was prepared. In order to form the first material of silicon and form the second material of titanium nitride, a silicon target and a titanium target were set on the sputtering apparatus. As the current collector 3, copper foil (YB-10 produced by Nippon Denkai, Ltd.) was used. The copper foil was moved reciprocally between areas below the two targets to alternately put silicon for the first layer 1 and titanium nitride for the second layer 2 on the copper foil, so as to form a negative electrode.

The first layer 1 of silicon was formed under an argon atmosphere with a pressure of 1 Pa and a traveling wave output of 400 W. The diameter of the target was 80 mm. The shutter opening time was 4 seconds. During the shutter opening time of 4 seconds, the first layer 1 having a thickness of about 3 nm was formed.

The second layer 2 of titanium nitride was formed under an atmosphere of $Ar/N_2$ mixed gas (volume ratio: 10:1) with a pressure of 1.2 Pa and a traveling wave output of 300 W. The diameter of the target was 80 mm. The shutter opening time was 1 second. During the shutter opening time of 1 second, the second layer 2 having a thickness of about 1 nm was formed.

In order to change the gas components, a purge time of 5 seconds was provided between the formation of the first layer 1 and the formation of the second layer 2.

With the above-described conditions, the first layers 1 and the second layers 2 were alternately formed on the Cu foil to a total of 250 layers. As a result, a negative electrode including the active substance structure 4 having a thickness of 1 μm provided on the Cu foil was produced. The layer contacting the Cu foil as the current collector 3 was the first layer 1.

COMPARATIVE EXAMPLE 1

As a comparative example, the same conditions as those of Example 1 were used except that the second layers 2 were not formed, so that a negative electrode including only the first layer (silicon layer) provided on the copper foil as the current collector 3 was prepared. The thickness was 0.75 μm.
(Evaluation 1)

The obtained negative electrodes were cut into circles having a diameter of 11.3 mm, and evaluation cells as shown in FIG. 4 were produced using lithium metal as the positive electrode. The evaluation cells were charged and discharged repeatedly to find the relationship between the number of cycles and capacity maintenance ratio. The "capacity maintenance ratio" means a ratio of an actually measured capacity with respect to a reference capacity, which is the maximum capacity observed during a period from the first charge/discharge until the 10th first charge/discharge.

As the electrolyte solution, a solution obtained by dissolving 1 mol of $LiPF_6$ in 1 L of a mixed solvent of ethylene carbonate, methylethyl carbonate and diethyl carbonate (mixing ratio: 3:5:2 in volume) was used.

The measurement was performed under the following conditions: charging current and discharging current: 50 μA; voltage when charging is stopped: 1 V; voltage when discharging is stopped: 0 V; pause between charging and discharging: 10 minutes; and measuring environment temperature: 25° C.

Figure 6:
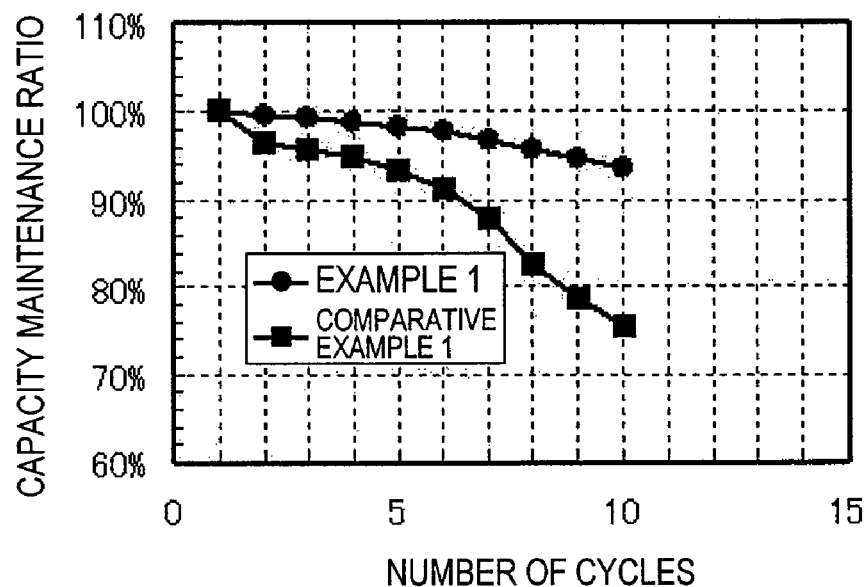
FIG. 6 is a graph illustrating the relationship between the number of charge/discharge cycles and the capacity maintenance ratio of Example 1 according to the present invention and Comparative Example 1.

FIG. 6 shows the relationship between the number of cycles and the capacity maintenance ratio as the measurement results. After the 10th cycle, the capacity maintenance ratio of Comparative Example 1 including only the first layer (silicon layer) is decreased down to about 75.6%, whereas the capacity maintenance ratio of the lithium secondary battery including the electrode of Example 1 is kept at 98.6%. It is understood that Example 1 provides a higher capacity maintenance ratio.

EXAMPLE 2

A sputtering apparatus which allows a plurality of targets to be set thereon and has a function of moving the substrate between the targets and a function of changing gas components and gas flow rate was prepared. In order to form the first material of silicon and form the second material of zirconium nitride, a silicon target and a zirconium target were set on the sputtering apparatus. As the current collector 3, copper foil (YB-10 produced by Nippon Denkai, Ltd.) was used. The copper foil was moved reciprocally between areas below the two targets to alternately put silicon for the first layer 1 and zirconium nitride for the second layer 2 on the copper foil, so as to form a negative electrode.

The first layer 1 of silicon was formed under an argon atmosphere with a pressure of 1 Pa and a traveling wave output of 400 W. The diameter of the target was 80 mm. The shutter opening time was 4 seconds. During the shutter opening time of 4 seconds, the first layer 1 having a thickness of about 3 nm was formed.

The second layer 2 of zirconium nitride was formed under an atmosphere of $Ar/N_2$ mixed gas (volume ratio: 10:1) with a pressure of 1 Pa and a traveling wave output of 300 W. The diameter of the target was 80 mm. The shutter opening time was 1 second. During the shutter opening time of 1 second, the second layer 2 having a thickness of about 1.4 nm was formed.

In order to change the gas components, a purge time of 5 seconds was provided between the formation of the first layer 1 and the formation of the second layer 2.

With the above-described conditions, the first layers 1 and the second layers 2 were alternately formed on the Cu foil to a total of 250 layers. As a result, a negative electrode including the active substance structure 4 having a thickness of 1.1 μm provided on the Cu foil was produced. The layer contacting the Cu foil as the current collector 3 was the first layer 1.

COMPARATIVE EXAMPLE 2

As a comparative example, the same conditions as those of Example 1 were used except that the second layers 2 were not formed, so that a negative electrode including only the first layer (silicon layer) provided on the copper foil as the current collector 3 was prepared. The thickness was 0.75 μm.
(Evaluation 2)

The obtained negative electrodes were cut into circles having a diameter of 11.3 mm, and evaluation cells as shown in FIG. 4 were produced using lithium metal as the positive electrode. The evaluation cells were charged and discharged repeatedly to find the relationship between the number of cycles and the capacity maintenance ratio. The "capacity maintenance ratio" means a ratio of an actually measured capacity with respect to a reference capacity, which is the maximum capacity observed during a period from the first charge/discharge until the 10th first charge/discharge.

As the electrolyte solution, a solution obtained by dissolving 1 mol of $LiPF_6$ in 1 L of a mixed solvent of ethylene carbonate, methylethyl carbonate and diethyl carbonate (mixing ratio: 3:5:2 in volume) was used.

The measurement was performed under the following conditions: charging current and discharging current: 50 μA; voltage when charging is stopped: 1 V; voltage when discharging is stopped: 0 V; pause between charging and discharging: 10 minutes; and measuring environment temperature: 25° C.

Figure 7:
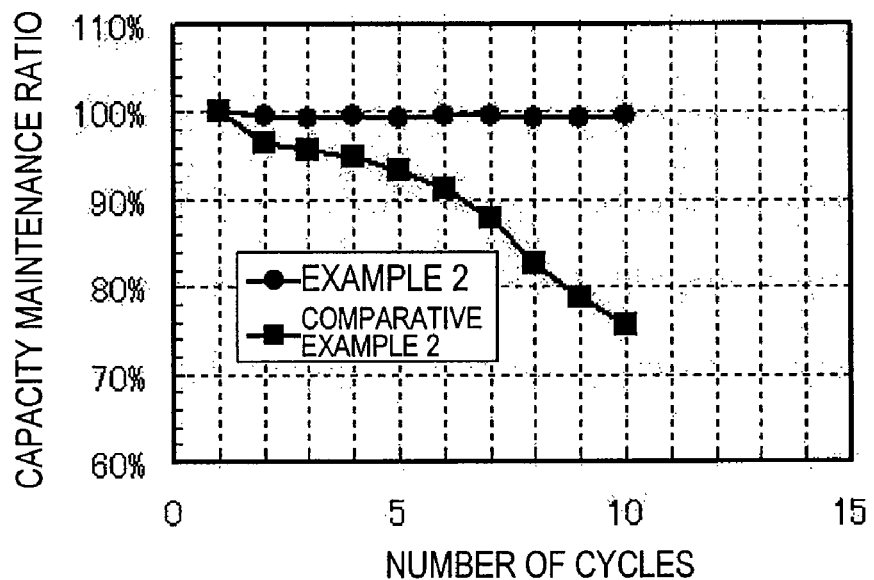
FIG. 7 is a graph illustrating the relationship between the number of charge/discharge cycles and the capacity maintenance ratio of Example 2 according to the present invention and Comparative Example 2.

FIG. 7 shows the relationship between the number of cycles and the capacity maintenance ratio as the measurement results. After the 10th cycle, the capacity maintenance ratio of Comparative Example 2 including only the first layer (silicon layer) is decreased down to about 75.6%, whereas the capacity maintenance ratio of the lithium secondary battery including the electrode of Example 2 is kept at 93.5%. It is understood that Example 2 provides a higher capacity maintenance ratio.

EXAMPLE 3

A sputtering apparatus which allows a plurality of targets to be set thereon and has a function of moving the substrate between the targets and a function of changing gas components and gas flow rate was prepared. In order to form the first material of silicon and form the second material of hafnium nitride, a silicon target and a hafnium target were set on the sputtering apparatus. As the current collector 3, copper foil (YB-10 produced by Nippon Denkai, Ltd.) was used. The copper foil was moved reciprocally between areas below the two targets to alternately put silicon for the first layer 1 and hafnium nitride for the second layer 2 on the copper foil, so as to form a negative electrode.

The first layer 1 of silicon was formed under an argon atmosphere with a pressure of 1 Pa and a traveling wave output of 400 W. The diameter of the target was 80 mm. The shutter opening time was 4 seconds. During the shutter opening time of 4 seconds, the first layer 1 having a thickness of about 3 nm was formed.

The second layer 2 of hafnium nitride was formed under an atmosphere of $Ar/N_2$ mixed gas (volume ratio: 10:1) with a pressure of 1 Pa and a traveling wave output of 300 W. The diameter of the target was 80 mm. The shutter opening time was 1 second. During the shutter opening time of 1 second, the second layer 2 having a thickness of about 1.4 nm was formed.

In order to change the gas components, a purge time of 5 seconds was provided between the formation of the first layer 1 and the formation of the second layer 2.

With the above-described conditions, the first layers 1 and the second layers 2 were alternately formed on the Cu foil to a total of 250 layers. As a result, a negative electrode including the active substance structure 4 having a thickness of 1 μm provided on the Cu foil was produced. The layer contacting the Cu foil as the current collector 3 was the first layer 1.

COMPARATIVE EXAMPLE 3

As a comparative example, the same conditions as those of Example 1 were used except that the second layers 2 were not formed, so that a negative electrode including only the first layer (silicon layer) provided on the copper foil as the current collector 3 was prepared. The thickness was 0.75 μm.
(Evaluation 3)

The obtained negative electrodes were cut into circles having a diameter of 11.3 mm, and evaluation batteries as shown in FIG. 4 were produced using lithium metal as the positive electrode. The evaluation batteries were charged and discharged repeatedly to find the relationship between the number of cycles and the capacity maintenance ratio. The "capacity maintenance ratio" means a ratio of an actually measured capacity with respect to a reference capacity, which is the maximum capacity observed during a period from the first charge/discharge until the 10th first charge/discharge.

As the electrolyte solution, a solution obtained by dissolving 1 mol of $LiPF_6$ in 1 L of a mixed solvent of ethylene carbonate, methylethyl carbonate and diethyl carbonate (mixing ratio: 3:5:2 in volume) was used.

The measurement was performed under the following conditions: charging current and discharging current: 50 μA; voltage when charging is stopped: 1 V; voltage when discharging is stopped: 0 V; pause between charging and discharging: 10 minutes; and measuring environment temperature: 25° C.

Figure 8:
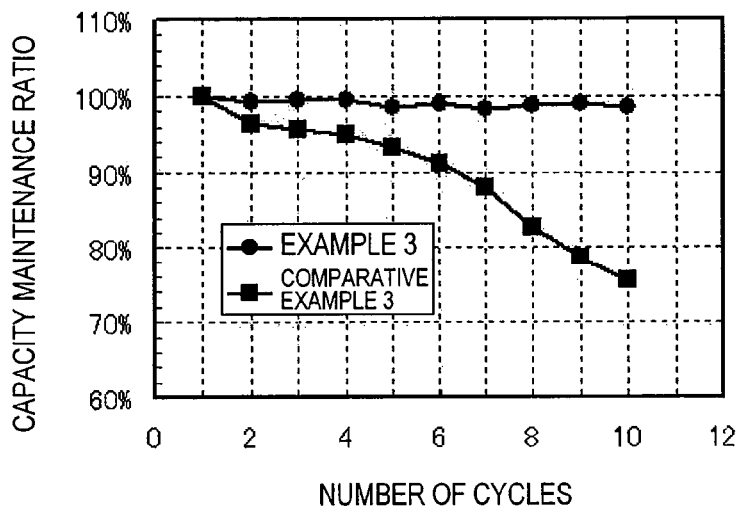
FIG. 8 is a graph illustrating the relationship between the number of charge/discharge cycles and the capacity maintenance ratio of Example 3 according to the present invention and Comparative Example 3.

FIG. 8 shows the relationship between the number of cycles and the capacity maintenance ratio as the measurement results. After the 10th cycle, the capacity maintenance ratio of Comparative Example 3 including only the first layer (silicon layer) is decreased down to about 75.6%, whereas the capacity maintenance ratio of the lithium secondary battery including the electrode of Example 3 is kept at 99.6%. It is understood that Example 3 provides a higher capacity maintenance ratio.

EXAMPLE 4

A silicon layer having a thickness of 5 μm was formed on a sapphire substrate having a thickness of 0.5 mm using the same apparatus and the same materials as those of Example 1, and the Young's modulus thereof was measured.

The silicon layer was formed under an argon atmosphere with a pressure of 1 Pa and a traveling wave output of 400 W. The shutter was opened for 6660 seconds.

The Young's modulus was measured using Nanoindenter XP produced by MTS, U.S. This instrument has a function of obtaining Young's modulus based on the displacement amount of the indenter and the stress applied to the indenter when a load is removed from the silicon layer after once applied thereto with the indenter. As the indenter, Berkovitch indenter was used. The value measured at the indentation depth of 500 nm from the surface was set as the Young's modulus. All the values of the Young's modulus mentioned in this specification were measured by this instrument. As a result of the measurement, the Young's modulus of the silicon layer formed here was 90±5 GPa.

Similarly, a titanium nitride layer having a thickness of 3 μm was formed on a sapphire substrate having a thickness of 0.5 mm using the same apparatus and the same materials as those of Example 1, and the Young's modulus thereof was measured.

The titanium nitride layer was formed under an $Ar/N_2$ mixed gas (volume ratio: 10:1) with a pressure of 1.2 Pa and a traveling wave output of 300 W. The shutter was opened for 6660 seconds. The Young's modulus of the titanium nitride layer formed here was 300±15 GPa.

Similarly, a zirconium nitride layer having a thickness of 3 μm was formed on a sapphire substrate having a thickness of 0.5 mm using the same apparatus and the same materials as those of Example 2, and the Young's modulus thereof was measured.

The zirconium nitride layer was formed under an $Ar/N_2$ mixed gas (volume ratio: 10:1) with a pressure of 1.2 Pa and a traveling wave output of 300 W. The shutter was opened for 6660 seconds. The Young's modulus of the zirconium nitride layer formed here was 273±14 GPa.

Similarly, a hafnium nitride layer having a thickness of 3 μm was formed on a sapphire substrate having a thickness of 0.5 mm using the same apparatus and the same materials as those of Example 3, and the Young's modulus thereof was measured.

The hafnium nitride layer was formed under an $Ar/N_2$ mixed gas (volume ratio: 10:1) with a pressure of 1.2 Pa and a traveling wave output of 300 W. The shutter was opened for 6660 seconds. The Young's modulus of the hafnium nitride layer formed here was 259±14 GPa.

The Young's modulus of first and second Cu foils used as the current collector 3 (YB-10 and YB-20 produced by Nippon Denkai, Ltd.) was measured. The Young's modulus was 85±3 GPa and 82±4 GPa, respectively. For fixing the Cu foil on an aluminum table for measuring the Young's modulus, two-liquid mixing-type, epoxy-based adhesive was used. The first copper foil and the second copper foil have different thicknesses.

A negative electrode for a lithium secondary battery was produced by putting the silicon layers as the first layers 1 and the titanium nitride layers as the second layers 2 alternately to a total of 1000 layers on the first Cu foil (YB-10 produced by Nippon Denkai, Ltd.) as the current collector 3, using the same apparatus and the same conditions as those of Example 1. The produced negative electrode was used to form a coin-shaped cell in the manner described in Evaluation 1, and the capacity maintenance ratio after the 10th cycle was measured.

Table 1 shows the thickness of the first layer 1 and the second layer 2 of the produced samples, and the capacity maintenance ratio after the 10th cycle of the evaluation cells produced using the samples as negative electrodes.

TABLE 1

| Sample No | First layer thickness $T_1$ (nm) | Second layer thickness $T_2$ (nm) | Initial discharge capacity (μAh) | Capacity maintenance ratio after 10th cycle |
|---|---|---|---|---|
| 4-1 | 1.5 | 1.5 | 881 | 99.8 |
| 4-2 | 1.5 | 3.0 | 887 | 99.8 |
| 4-3 | 1.5 | 4.5 | 821 | 99.9 |
| 4-4 | 1.5 | 6.0 | 15 | 99.8 |
| 4-5 | 3.0 | 1.5 | 1838 | 98.1 |
| 4-6 | 3.0 | 3.0 | 1789 | 99.8 |
| 4-7 | 3.0 | 4.5 | 1626 | 99.7 |
| 4-8 | 3.0 | 6.0 | 18 | 99.8 |
| 4-9 | 4.5 | 1.5 | 2618 | 45.9 |
| 4-10 | 4.5 | 3.0 | 2531 | 51.2 |
| 4-11 | 4.5 | 4.5 | 2249 | 96.5 |
| 4-12 | 4.5 | 6.0 | 22 | 99.1 |
| 4-13 | 6.0 | 1.5 | 3491 | 35.5 |
| 4-14 | 6.0 | 3.0 | 3310 | 50.6 |
| 4-15 | 6.0 | 4.5 | 3120 | 55.3 |
| 4-16 | 6.0 | 6.0 | 35 | 61.2 |

As shown in Table 1, as the thickness of the first layer including a negative electrode active substance increases, the initial discharge capacity increases. The reason is that the volume of the first layer increases in proportion to the thickness of the first layer, and so the volume of the active substance capable of occluding lithium is increased. However, the initial discharge capacity of Sample Nos. 4-4, 4-8 and 4-12 is merely several percent of that of the other samples having the same thickness of first layer. It is understood that Sample Nos. 4-4, 4-8 and 4-12 are not suitable for a large-capacity secondary battery. A conceivable reason for such a small initial discharge capacity is that because the second layer is as thick as 6 μm, lithium is inhibited from permeating the second layer and is unlikely to expand to the first layer. Nevertheless, Sample Nos. 4-4, 4-8 and 4-12 have a superb cycle characteristic as described below.

The capacity maintenance ratio after the 10th cycle of Sample Nos. 4-9, 4-10, 4-13, 4-14, 4-15 and 4-16 is lower than 80%. A conceivable reason for this is that the strength of the second layer 2 is relatively small with respect to the stress generated by the expansion of the first layer 1. However, these values are improved over those of a lithium secondary battery having a conventional structure with no second layer 2.

Regarding the other samples, good results are obtained with a large initial discharge capacity and a capacity maintenance ratio of not less than 80% after the 10th cycle. Thus, it is understood that the thickness $T_2$ of the second layer preferably fulfills 0 nm<$T_2$<6 nm and the thickness $T_1$ of the first layer preferably fulfills 0 nm<$T_1$≦4.5 nm.

EXAMPLE 5

A negative electrode for a lithium secondary battery was produced by putting the silicon layers as the first layers 1 and the zirconium nitride layers as the second layers 2 alternately to a total of 1000 layers on the second Cu foil (YB-20 produced by Nippon Denkai, Ltd.) as the current collector 3, using the same apparatus and the same conditions as those of Example 2. The produced negative electrode was used to form a coin-shaped cell in the manner described in the section of evaluation, and the capacity maintenance ratio after the 10th cycle was measured.

Table 2 shows the thickness of the first layer 1 and the second layer 2 of the produced samples, and the capacity maintenance ratio after the 10th cycle of the evaluation cells produced using the samples as negative electrodes.

TABLE 2

| Sample No | First layer thickness $T_1$ (nm) | Second layer thickness $T_2$ (nm) | Initial discharge capacity (μAh) | Capacity maintenance ratio after 10th cycle |
|---|---|---|---|---|
| 5-1 | 1.5 | 1.5 | 852 | 99.5 |
| 5-2 | 1.5 | 3.0 | 873 | 99.8 |
| 5-3 | 1.5 | 4.5 | 720 | 99.1 |
| 5-4 | 1.5 | 6.0 | 15 | 99.9 |
| 5-5 | 3.0 | 1.5 | 1728 | 96.5 |
| 5-6 | 3.0 | 3.0 | 1715 | 98.1 |
| 5-7 | 3.0 | 4.5 | 1580 | 99.5 |
| 5-8 | 3.0 | 6.0 | 20 | 99.1 |
| 5-9 | 4.5 | 1.5 | 2591 | 49.2 |
| 5-10 | 4.5 | 3.0 | 2507 | 72.5 |
| 5-11 | 4.5 | 4.5 | 2270 | 95.1 |
| 5-12 | 4.5 | 6.0 | 22 | 99.9 |
| 5-13 | 6.0 | 1.5 | 3421 | 42.1 |
| 5-14 | 6.0 | 3.0 | 3301 | 56.1 |
| 5-15 | 6.0 | 4.5 | 3059 | 58.9 |
| 5-16 | 6.0 | 6.0 | 28 | 68.5 |

As shown in Table 2, as the thickness of the first layer including a negative electrode active substance increases, the initial discharge capacity increases. The reason is that the volume of the first layer increases in proportion to the thickness of the first layer, and so the volume of the active substance capable of occluding lithium is increased. However, the initial discharge capacity of Sample Nos. 5-4, 5-8 and 5-12 is merely about 5% percent of that of the other samples having the same thickness of first layer. It is understood that Sample Nos. 5-4, 5-8 and 5-12 are not suitable for a large-capacity secondary battery. A conceivable reason for such a small initial discharge capacity is that because the second layer is as thick as 6 μm, lithium is inhibited from permeating the second layer and is unlikely to expand to the first layer. Nevertheless, Sample Nos. 5-4, 5-8 and 5-12 have a superb cycle characteristic as described below.

The capacity maintenance ratio after the 10th cycle of Sample Nos. 5-9, 5-10, 5-13, 5-14, 5-15 and 5-16 is lower than 80%. A conceivable reason for this is that the strength of the second layer 2 is relatively small with respect to the stress generated by the expansion of the first layer 1. However, these values are improved over those of a lithium secondary battery having a conventional structure with no second layer 2.

Regarding the other samples, good results are obtained with a large initial discharge capacity and a capacity maintenance ratio of not less than 80% after the 10th cycle. Thus, it is understood that the thickness $T_2$ of the second layer preferably fulfills 0 nm<$T_2$<6 nm and the thickness $T_1$ of the first layer preferably fulfills 0 nm<$T_1$≦4.5 nm.

COMPARATIVE EXAMPLES 4 THROUGH 6

As Comparative Examples 4 through 6, the same conditions as those of Example 1 were used except that the second layers 2 were not formed, so that a negative electrode including only the first layer (silicon layer) provided on the copper foil as the current collector 3 was prepared. In Comparative Examples 4 through 6, 1000 first layers 1 of silicon are laminated, with the thickness of the first layers 1 being 3 μm, 4.5 μm and 6 μm in the respective comparative examples. The negative electrodes produced in Comparative Examples 4 through 6 were used to form coin-shaped cells in the manner described in Evaluation 1, and the capacity maintenance ratio up to the 10th cycle was measured. The results are shown in FIG. 9.

Figure 9:
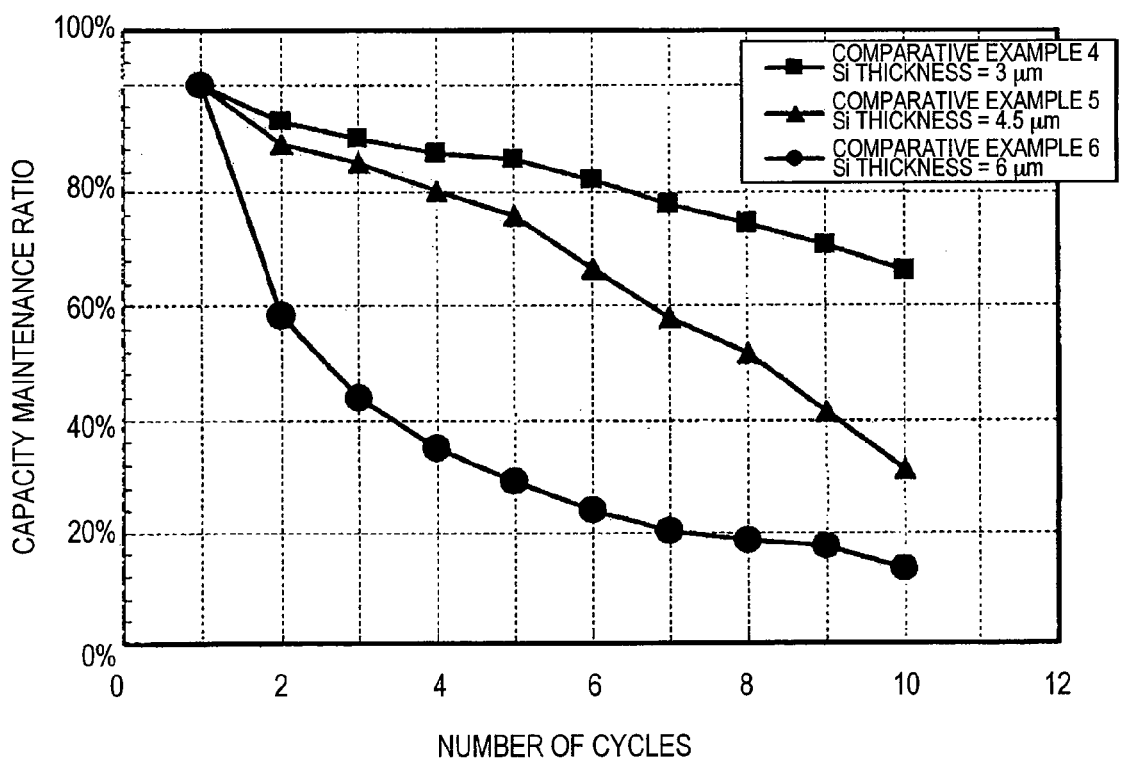
FIG. 9 is a graph illustrating the relationship between the number of charge/discharge cycles and the capacity maintenance ratio of Comparative Examples 4 through 6.
Figure 10:
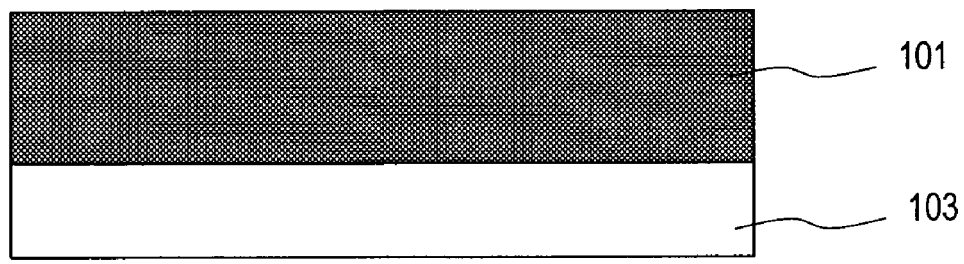
FIG. 10 is a cross-sectional view schematically showing a structure of a conventional negative electrode for a lithium secondary battery.

As is clear from FIG. 9, in lithium secondary batteries using the electrodes of Comparative Examples 4 through 6, with no second layer 2, as the negative electrode, the cycle characteristic is conspicuously deteriorated and the capacity maintenance ratio after 10th cycle is lowered down to 66.3%, 31.3% and 13.3%, respectively. These values are lower than those of Sample Nos. 4-9, 4-10, 4-13, 4-14 and 4-15 of Example 4 and Sample Nos. 5-9, 5-10, 5-13, 5-14 and 5-15. From this, it is understood that a lithium secondary battery according to the present invention improves the cycle characteristic over the conventional art by providing a second layer 2.

INDUSTRIAL APPLICABILITY

An electrode for a lithium secondary battery, and a lithium secondary battery using the same, according to the present invention are applicable to various forms of lithium secondary batteries, and are especially preferably applicable to a lithium secondary battery required to have a good cycle characteristic.

The invention claimed is:

1. An electrode for a lithium secondary battery, comprising a current collector and an active substance structure provided on the current collector, wherein:
   the active substance structure includes at least one first layer containing a first material for occluding and releasing lithium ions and at least one second layer containing a conductive second material which does not chemically react with lithium;
   the at least one first layer and the at least one second layer are alternately laminated;
   the at least one second layer has a Young's modulus larger than the Young's modulus of the at least one first layer;
   the second material is a conductive metal compound,
   the second material has a Young's modulus of 200 GPa or greater, and
   the second material is one material selected from metal nitrides, metal carbides and metal borides.

2. The electrode for a lithium secondary battery of claim 1, wherein the second material is a nitride of a group 4A metal material.

3. The electrode for a lithium secondary battery of claim 2, wherein the second material is one, or a mixture of two, selected from titanium nitride, zirconium nitride and hafnium nitride.

4. The electrode for a lithium secondary battery of claim 3, wherein at least two first layers and at least two second layers are included.

5. The electrode for a lithium secondary battery of claim 4, wherein each of the at least two second layers have a thickness of smaller than 6 nm.

6. The electrode for a lithium secondary battery of claim 5, wherein each of the at least two first layers have a thickness of equal to or smaller than 4.5 nm.

7. The electrode for a lithium secondary battery of claim 6, wherein each of the at least two second layers have a plurality of openings.

8. The electrode for a lithium secondary battery of claim 7, wherein the electrode is a negative electrode.

9. The electrode for a lithium secondary battery of claim 8, wherein the first material contains at least one selected from silicon, germanium and tin.

10. The electrode for a lithium secondary battery of claim 7, wherein the electrode is a positive electrode.

11. The electrode for a lithium secondary battery of claim 10, wherein the first material contains a composite oxide or a composite sulfide of a transition metal material containing lithium.

* * * * *